United States Patent [19]
Arai et al.

[11] Patent Number: 4,870,693
[45] Date of Patent: Sep. 26, 1989

[54] MASK INSPECTING APPARATUS

[75] Inventors: Tetsuyuki Arai; Shigeru Takemoto, both of Kanagawa; Yoshihiko Fujimori, Tokyo, all of Japan

[73] Assignee: Nikon Corporation, Tokyo, Japan

[21] Appl. No.: 158,069

[22] Filed: Feb. 12, 1988

Related U.S. Application Data

[63] Continuation-in-part of Ser. No. 877,337, Jun. 23, 1986, abandoned.

[30] Foreign Application Priority Data

Jun. 28, 1985 [JP] Japan ................................. 60-140429
Oct. 18, 1985 [JP] Japan ................................. 60-231254

[51] Int. Cl.$^4$ .......................... G06K 9/00; G09G 1/16
[52] U.S. Cl. ........................................ 382/8; 340/721; 340/723; 340/732; 382/61
[58] Field of Search ...................... 382/8, 61; 340/731, 340/705, 721, 734, 735, 723, 732; 356/237; 358/104; 364/521; 430/5, 22, 30; 378/34, 35

[56] References Cited

U.S. PATENT DOCUMENTS 4,295,135 10/1981 Sukonick ............................. 340/721
4,692,758 9/1987 Fawcett et al. ...................... 340/731

Primary Examiner—Leo H. Boudreau
Attorney, Agent, or Firm—Shapiro and Shapiro

[57] ABSTRACT

A pattern forming apparatus for inverting at least one of plural patterns according to numerical design data respectively representing the plural patterns and synthesizing thus inverted pattern with the remainder of the plural patterns, comprises first operation device for attaching a flag of a positive image to the design data of uninverted patterns, and attaching a flag of an inverted image to the design data of inverted patterns, second operation device for handling the entire area of either inverted patterns or uninverted ones among the plural patterns as a single pattern, and attaching a corresponding flag to the design data of the pattern, and image forming device for forming image data of the area according to the data of the second operation device and then forming image data of each pattern according to the data of the first operation device.

27 Claims, 18 Drawing Sheets

| | | |
|---|---|---|
| FA1 | 1 | D(PA1) |
| FA2 | 1 | D(PA2) |
| FC1 | 1 | D(PC1) |
| FB1 | 0 | D(PB1) |
| FB2 | 0 | D(PB2) |
| FBB | 1 | D(PBB) |

| BD(1.1) |
|---|
| BD(2.1) |
| BD(3.1) |
| BD(3.2) |
| BD(2.2) |
| BD(1.2) |
| BD(1.3) |
| BD(2.3) |
| BD(3.3) |

(b)

| | | |
|---|---|---|
| 1 | D(Pc1) | } DC |
| 1 | D(Pc2) | |
| MC | | |
| 1 | D(Pa0) | } DA |
| 0 | D(Pa1) | |
| 0 | D(Pa2) | |
| 0 | D(Pa3) | |
| 0 | D(Pa4) | |
| MC | | |
| 1 | D(Pb0) | } DB |
| 0 | D(Pb1) | |
| 0 | D(Pb2) | |
| 0 | D(Pb3) | |
| 0 | D(Pb4) | |
| END | | |

MASK INSPECTING APPARATUS

This is a continuation-in-part application of Ser. No. 877,337, filed June 23, 1986, now abandoned.

BACKGROUND OF THE INVENTION

1. Field of the Invention

The present invention relates to an inspecting apparatus for comparing a pattern, formed by an opaque material such as chromium on a radiation-transmitting substrate, of a mask or a reticle employed in the manufacture of semiconductor devices (hereinafter collectively called mask) with design data of said pattern.

2. Related Background Art

A mask is currently prepared by individual exposures of different patterns on different areas of a substrate, and design data of plural patterns formed in the mask are recorded on a recording medium such as a magnetic tape. According to the purpose, the pattern indicated by the design data can be either positively or negatively exposed by changing the characteristics of the photoresist to be coated on the substrate. In the case of a negative exposure, on the substrate, of a pattern based on certain design date, the exposed pattern is an inversion of the original design data so that the pattern formed on the mask is different from the design data recorded on the recording medium. Also a simple pattern inversion of the design data requires a long processing time on a computer.

SUMMARY OF THE INVENTION

An object of the present invention is to provide a mask inspecting apparatus requiring only a short time for inverting a pattern indicated by design data.

The above-mentioned object is achieved, according the present invention, by attaching a positive image flag to design data to be non-inverted and an inverted image flag to design data to be inverted by means of first process means, then handling either areas containing patterns of positive image or areas containing patterns of inverted image as a pattern and attaching a corresponding flag to the design data of said pattern by means of second process means, and forming, by means of image forming means, image data of the areas according to the data of said second process means and then forming image data of the patterns according to the data of said first process means.

BRIEF DESCRIPTION OF THE DRAWINGS

FIG. 22 shows the recording condition of a disk in the improved embodiment of the present invention;

DETAILED DESCRIPTION OF THE PREFERRED EMBODIMENTS

Figure 2:
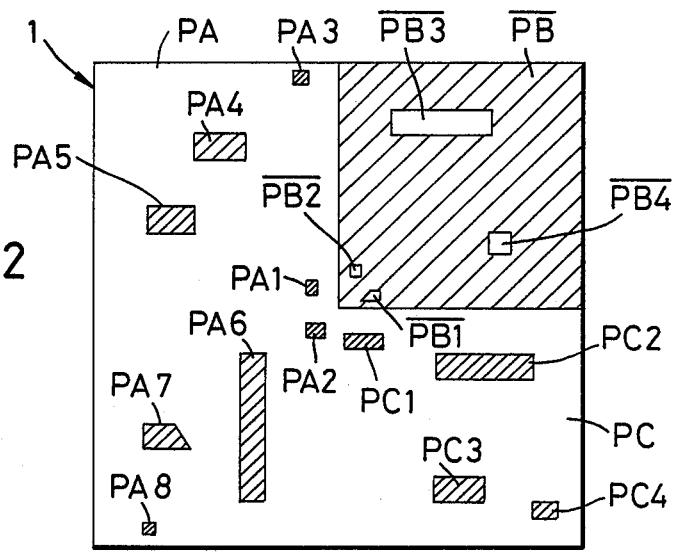
FIG. 2 is a plan view showing an example of a mask pattern.
Figure 3:
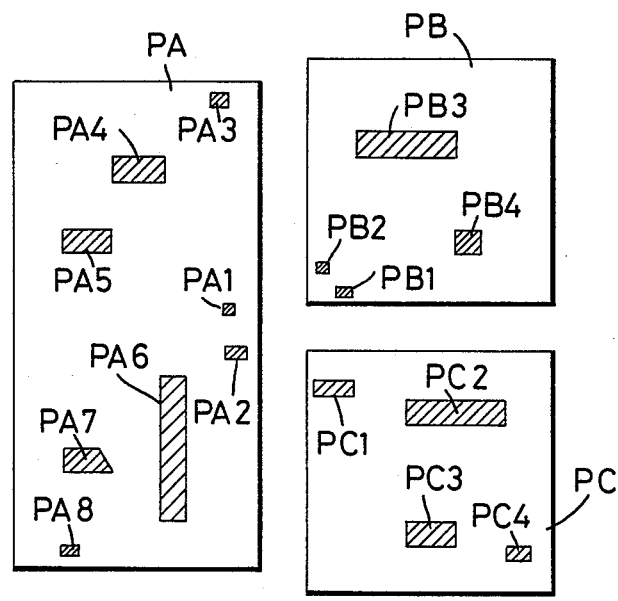
FIG. 3 is a plan view of plural patterns represented by design data.

Now the present invention will be clarified in detail by an embodiment shown in the attached drawings. In the following description there is explained a case of obtaining a pattern as shown in FIG. 2. The pattern of a mask 1 shown in FIG. 2 is composed of reference patterns PA, $\overline{PB}$ and PC which are placed in mutually abutting positions. As the design data are originally given as positive patterns PA, PB and PC as shown in FIG. 3, an inverted pattern $\overline{PB}$ has to be prepared from the pattern PB. Each of the patterns PA, PB, PC is composed of one or plural fine patterns.

Figure 1:
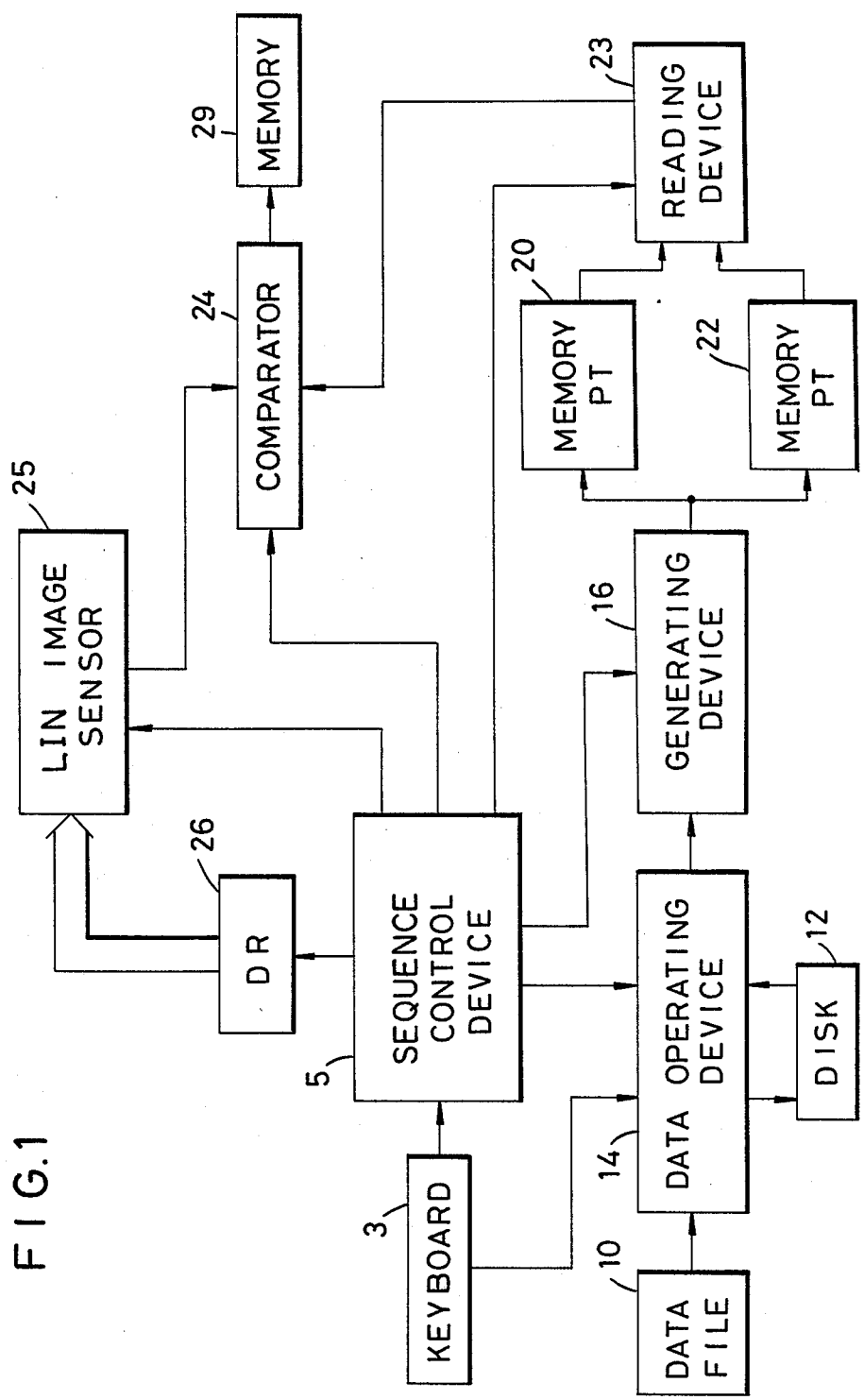
FIG. 1 is a block diagram of an embodiment of the present invention.
Figure 4:
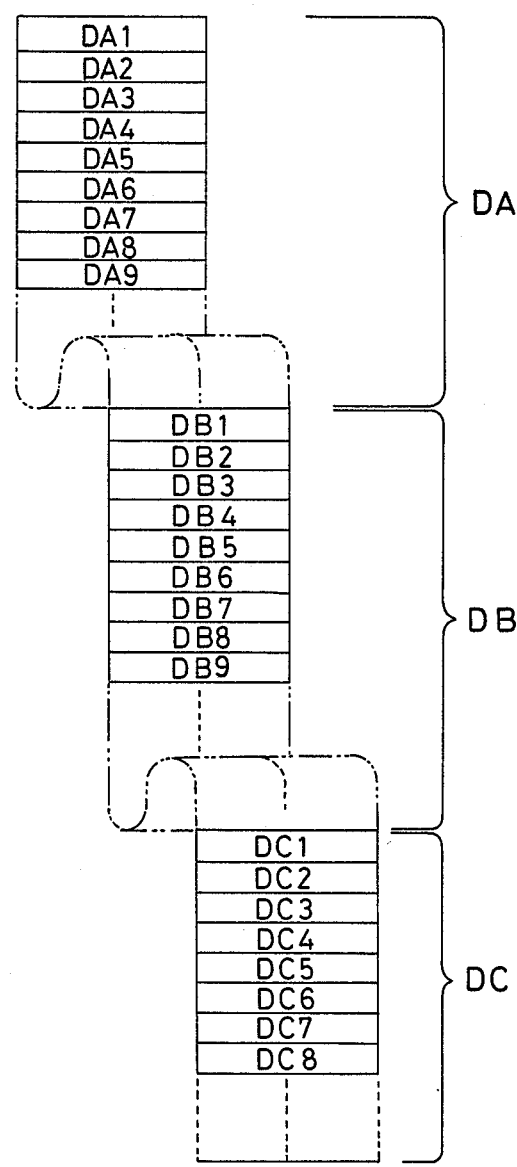
FIG. 4 is a schematic view of numerical data.

Referring to FIG. 1, a data file 10 stores design data DA, DB, DC numerically representing patterns PA, PB, PC as shown in FIG. 4 (hereinafter called numerical data). The numerical data DA of the pattern PA contains data DA1, DA2, . . . representing the end points and inclination of fine patterns PA1–PA8 (see FIG. 3) and data DA0 indicating the area of the pattern PA. Similarly the numerical data DB of the pattern PB contains DB1, DB2, . . . representing fine patterns PB1–PB4 and data DB0 indicating the area of pattern PB, and the numerical data DC of the pattern PC contains data DC1, DC2, . . . representing fine patterns PC1–PC4 and data DC0 indicating the area of the pattern PC. Said data file 10 is connected to a data operating device 14 having a disk 12. A keyboard 3 is connected to the data operating device 14 and a sequence control device 5 which controls the function of said data operating device 14, a raster information generating device 16, a reading device 23, a comparator 24, a linear image sensor 25 and a driver 26.

The output of the data operating device 14 is supplied, through the raster information generating device 16, to memory parts 20, 22 which store the patterns shown in FIG. 2 eventually as image data in the form of logic values "1" and "0" (for example "1" for the hatched areas in FIG. 2 and "0" for other areas).

Figure 5:
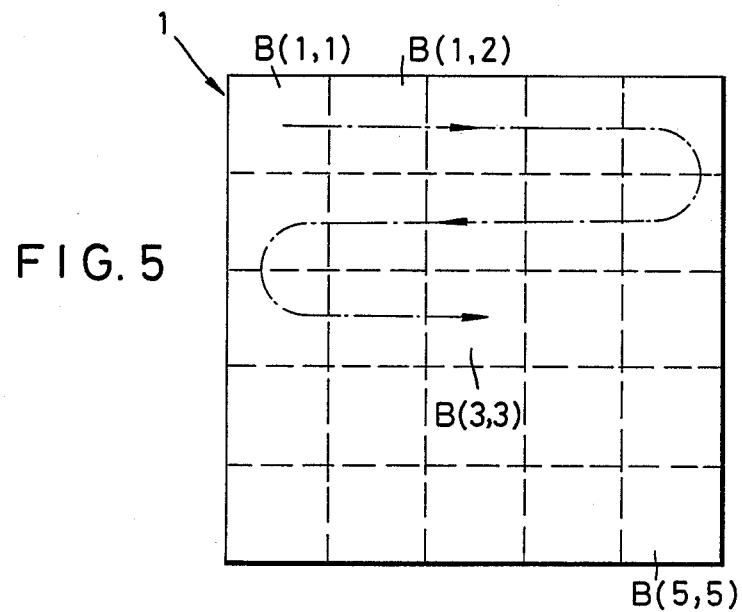
FIG. 5 is a schematic view showing a process unit block.
Figure 6:
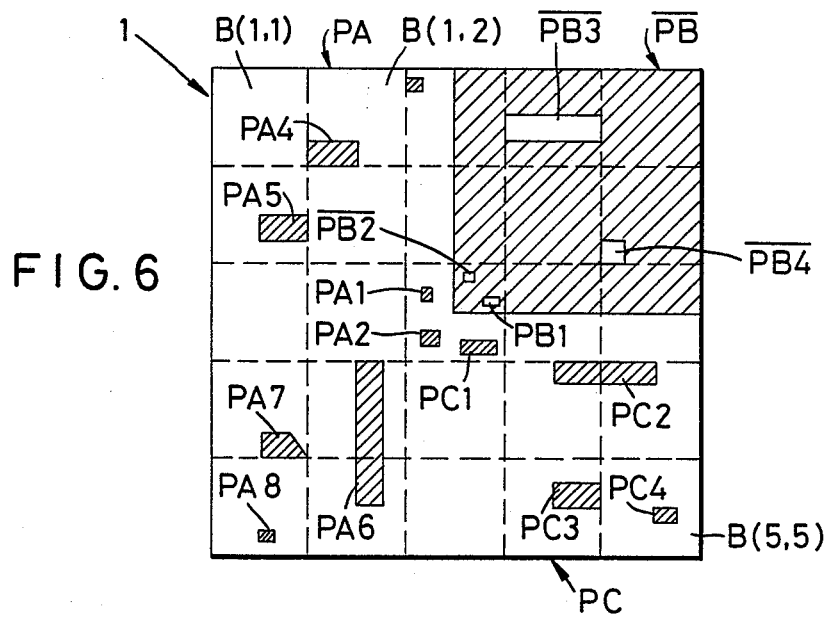
FIG. 6 is a plan view in which the patterns of FIG. 2 and the blocks of FIG. 5 are superposed.

In the present embodiment the process is conducted by dividing the mask 1 into suitable blocks B(m, n), wherein m, n are 1 to 5 as shown in FIG. 5. FIG. 6 shows the patterns of FIG. 2 to be formed eventually in the memory parts 20, 22 and the blocks B(m, n) shown in FIG. 5 in superposed manner. In the present embodiment image data are generated from the numerical data DA, DB, DC in the data field 10 for each block B(m, n) and are stored in one of the memory parts 20, 22. When data of a block, for example the block B(1, 1) are stored in one of the memory parts 20, 22, the data of the block B(1, 2) are stored in the other of said memory parts 20, 22, and simultaneously data are read from the former of said memory parts 20, 22. The sequence of data preparation of the blocks B(m, n) is indicated by an arrow shown in FIG. 5.

Figure 12:
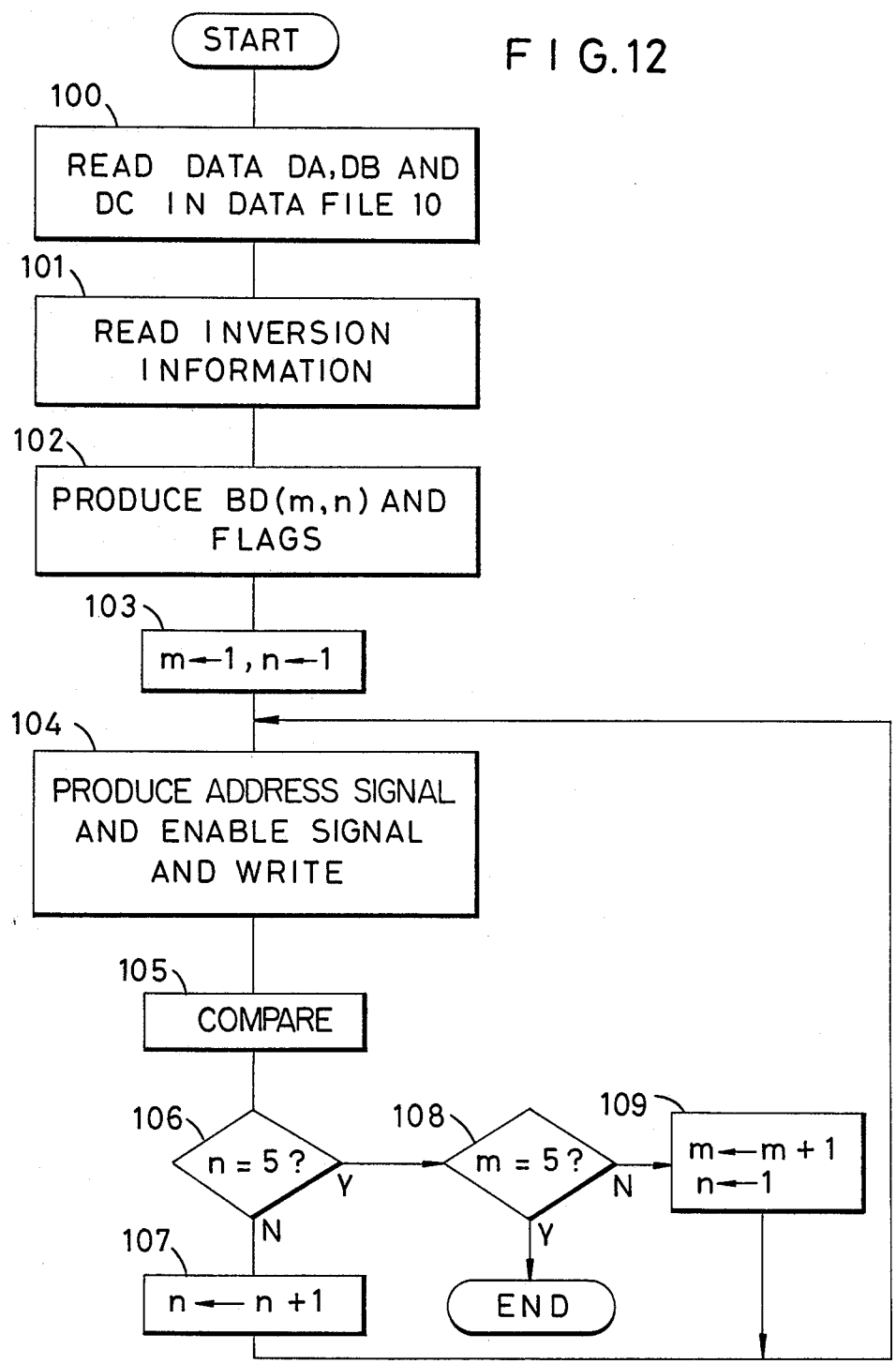
FIG. 12 is a flow chart showing the function of an embodiment of the present invention.

Now there will be given an explanation on the function of the above-explained embodiment while making reference to a flow chart shown in FIG. 12.

As explained before, numerical data DA, DB and DC respectively corresponding to the patterns PA, PB and PC (FIG. 3) are stored in the data file 10. At first, in a step 100, the data DA, DB, and DC are read and supplied to the data operating device. Then, in a step 101, inversion information, indicating the pattern to be inverted among plural reference patterns constituting the pattern of the opaque material of the mask to be inspected, is entered from the keyboard to the data operating device 14.

Figure 7:
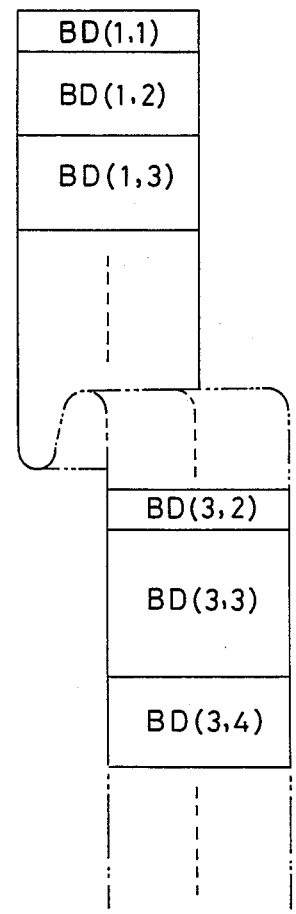
FIG. 7 is a schematic view of numerical data classified into blocks.

The data operating device 14 processes the data for each block B(m, n) in a step 102, and classifies the data DA, DB, DC for each block B(m, n). For instance, as shown in FIG. 6, a block B(1, 1) does not contain any pattern but a block B(1, 2) contains a pattern PA4. Similarly a block B(3, 3) contains patterns PA1, PA2, $\overline{PB1}$, $\overline{PB2}$ and PC1, in which the patterns $\overline{PB1}$ and $\overline{PB2}$ are obtained by inverting the patterns PB1 and PB2 as shown in FIG. 3. FIG. 7 shows the mode of said classification. As shown in FIG. 7, the numerical data which have been classified according to the patterns PA, PB and PC are classified as block data BD(m, n) corresponding to each block B(m, n) and stored in the disk 12. The data operating device prepares the block data BD(m, n), including data indicating the position of each fine pattern in each block, from the numerical data DA, DB and DC.

Figures 8, 9:
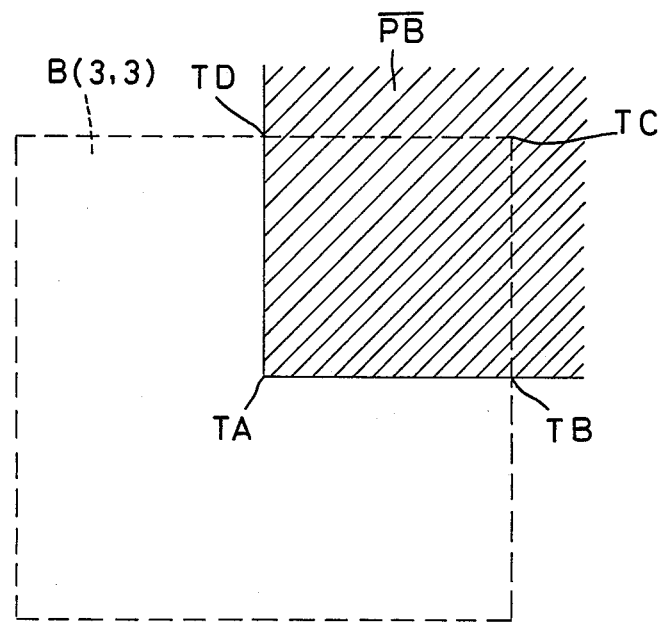
FIG. 8 is a schematic view showing numerical data of a block B (3, 3)
FIG. 9 is a schematic view showing an inverted image included in the block B(3, 3)

FIG. 8 illustrates the block data BD(3, 3) of the aforementioned block B(3, 3), which contains the patterns PA1, PA2 of the pattern A. It is now assumed that the positive patterns are represented by a logic value "1". As the patterns PA1, PA2 are to be recorded without inversion, flags FA1, FA2 of a logic value "1" are attached to indicate positive images. Data D(PA1) indicates the form of the patterns PAC and the position thereof in the block B(3, 3), while data D (PA2) indicate the form of the pattern PA2 and the position thereof in said block B(3, 3).

The block B(3, 3) also contains a pattern PC1 belonging to the pattern PC. Since it is a positive pattern, a flag FC1 of a logic value "1" is attached to data D(PC1) indicating the form of the pattern PC1 and the position thereof in the block B(3, 3).

The block B(3, 3) further contains patterns PB1, PB2 belonging to the pattern PB, in the inverted form, which is indicated by a logic value "0". Thus a flag FB1 of a logic value "0" indicating an inverted image is attached to data D(PB1) of the pattern PB1. Similarly a flag FB2 of a logic value "0" is attached to data D(PB2) if the pattern PB2.

The above-explained classifying operation is conducted for each block B(m, n), and the classified block data BD(m, n) are stored in the disk 12. In case a single form pattern lies over two or more blocks, the pattern is cut into each block and the corresponding numerical data are determined. For example the left-hand portion of the pattern PC2, shown in FIG. 6, is positioned in the block B(4, 4), while the right-hand portion thereof is positioned in the block B(4, 5). Consequently each portion is treated as a fine pattern in determining the corresponding data, and processed in the aforementioned manner.

After the above-explained classifying operation, the data operating device 14 prepares data, indicating the position in each block B(m, n) of the hatched areas of the pattern in FIG. 2, from the data and attaches image flags.

As an example, a block B(3, 3) contains, as shown in FIG. 9, a hatched portion of the pattern $\overline{PB}$. Position data TA, TB, TC and TD indicating said contained portion are added, as data D(PBB) to the data BD(3, 3) as shown in FIG. 8, and flag FBB of a logic value "1" is added indicating a positive image. This process is conducted for each block B(m, n).

A step 103 designates the block B(1, 1) to read the classified data BD(1, 1) for example by direct memory access from the disk 12 and supply said data to the raster information generating device 16. In this operation the last recorded one of the block data BD(1, 1) in the disk 12 is read first. Consequently in case block data BD(1, 1), the flag FBB and data D(PBB) are read first. Said reading operation of the data BD(m, n) is conducted in synchronization with the mask inspecting operation. The memory parts 20, 22 are cleared in advance.

In a step 104, the raster information generating device 16 receives the block data BD(1, 1) and generates, in response thereto, an address signal and an enable signal to one of the memory parts 20, 22 as will be explained later. In this operation, the aforementioned flag F is forwarded, together with said address signal and enable signal, to one of the memory parts 20, 22.

In said memory part 20 or 22, the logic value indicated by the flag F is recorded in an area designated by said address and enable signals.

In a step 105, the comparator 24 compares the output from the image sensor 25 with the contents of the memory part 20 read by the reading device 23, and the result of comparison is stored in the memory 29 composed of a recording medium such as a disk.

A step 106 discriminates whether the value of n for block B(m, n) is equal to 5. Since n=1 in this state, a step 107 executes a stepwise increment of the value of n to effect the comparison for the succeeding block B(1, 2). After the comparison for the block B(1, 5), the program proceeds from the step 106 to a step 108 for discriminating whether the value of m for the block B(m, n) is equal to 5. Since m=1 for the block B(1, 5) at this state, the program proceeds to a step 109 to return n to 1 and increase m by 1. In this manner the comparison is conducted from the block B(1, 1) to the block B(5, 5), whereupon the function of the apparatus is completed.

Figure 10A:
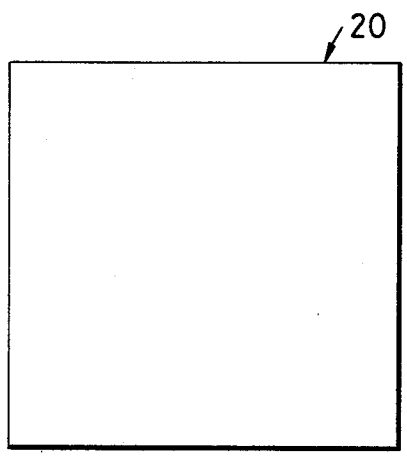
FIG. 10A, 10B, 10C and 10D are plan views showing a process of storage block data DB(3, 3) into memory.

In the following there will be explained the operation in the aforementioned block B(3, 3). At first a memory part to be used for storage, for example 20, is cleared to a logic value "0", as shown in FIG. 10A. Then among the block data BD(3, 3) for the block B(3, 3), the last recorded data D(PBB) are read and supplied to the raster information generating device 16, together with the flag FBB (cf. FIG. 8).

Figure 11:
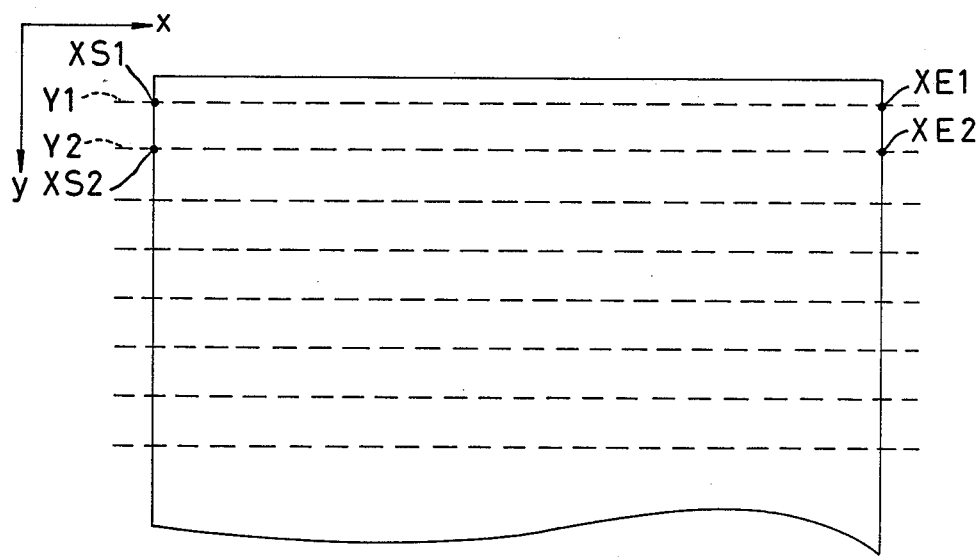
FIG. 11 is a schematic view showing block data and address information.

In response to said data D(PBB), the raster information generating device 16 supplies the memory part 20 with address and enables signals indicating the end positions (Y1, XS1) and (Y1, XE1) of the hatched area of the pattern PB in the block B(3, 3) as shown in FIG. 11, together with the flag FBB.

In the memory part 20, data designated by the flag FBB are stored in an area between the addresses (Y1, XS1) and (Y1, XE1). Since the flag FBB is "1" as shown in FIG. 8, logic values "1" indicating a positive image are recorded in the corresponding addresses of the memory part 20.

Figure 10B:
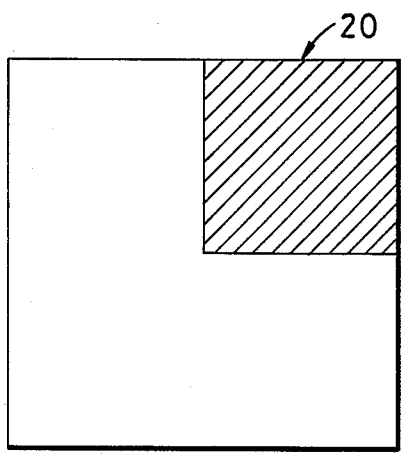

Similarly logic value "1" is recorded in an area between the addresses (Y2, XS2) and (Y2, XE2) of the memory part 20. This operation is conducted in succession to record "1" over the entire pattern of the data D(PBB). The result is shown in FIG. 10B wherein the hatched area corresponds to the logic value "1".

Figure 10C:
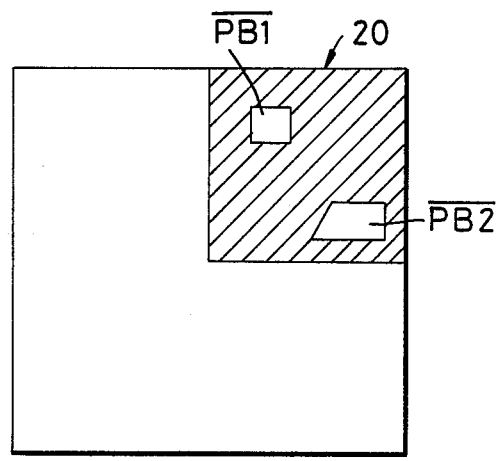

The data D(PB2) are read from the disk 12 together with the flag FB2. Then, as explained above, the raster information generating device 16 generates address information to record data designated by the flag FB2 in an area between the designated addresses of the memory part 20. As the flag FB2 is "0" as shown in FIG. 8, a logic value "0" indicating an inverted image is recorded in said area. Similarly the data D(PB1) are processed. In this manner the patterns $\overline{PB1}$, $\overline{PB2}$ are formed as shown in FIG. 10C.

Figure 10D:
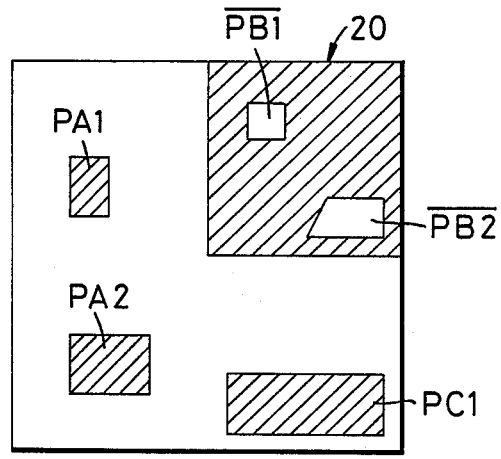

Subsequently data D(PC1) are read from the disk 12, together with flag FC1. Said data are processed in a similar manner, whereby a logic value "1", indicating a positive image, is recorded in a corresponding area of the memory 20 because the flag FC1 is "1". Data D(PA2) and D(PA1) are also processed in a similar manner. Consequently the patterns PA1, PA2 and PC1 are represented by a logic value "1" as shown in FIG. 10D.

In this manner the image data for the block B(3, 3) are formed in the memory 20. The operation is conducted in a similar manner for other blocks.

Naturally the present invention is not limited to the foregoing embodiment but can be modified in various manners. As an example, instead of employing two memory means for alternate image data formation as explained in the foregoing, there may be employed only one memory or three or more memories. Also there may be employed memory means of a large memory capacity to store all the patterns to be formed on a mask, instead of dividing into blocks as explained above.

The dividing method of the above-mentioned blocks is arbitrary and can be suitably selected according to the necessity. In the foregoing embodiment a portion of the inverted pattern area belonging to each block is treated as a pattern, but it is also possible to attach a flag to an area of the patterns PA and PC outside the hatched area.

The present invention is not limited to the mask pattern inspecting apparatus but is applicable also to manufacturing apparatus, wherein a mask can be prepared according to the data stored in the memory.

Figure 13:
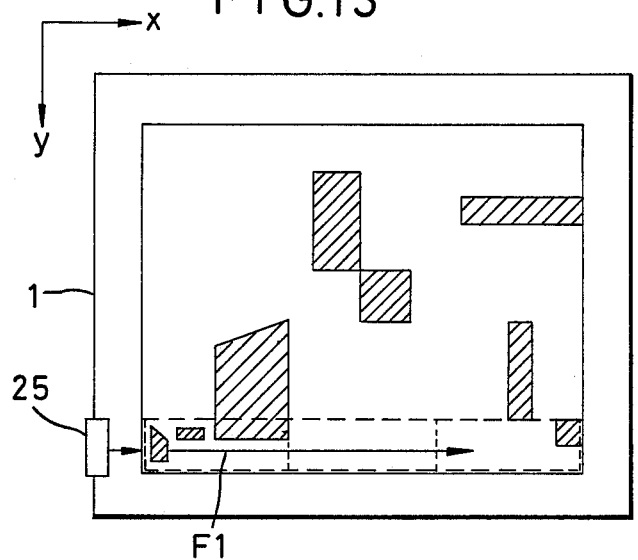
FIG. 13 is a plan view showing the direction of movement of a linear image sensor in an embodiment of the present invention.

In case of mask pattern inspection, a scanning operation is conducted, as shown in FIG. 13, by an image sensor 25 of 512 bits in a direction F1, under the control of a driver 26, (FIG. 1) and pixel data are serially outputted from the image sensor in synchronization. Simultaneously data are read serially from the memory and are compared, in synchronization, with the output of the image sensor 25 to inspect whether the pattern formed on the mask matches the design data.

Figure 14A:
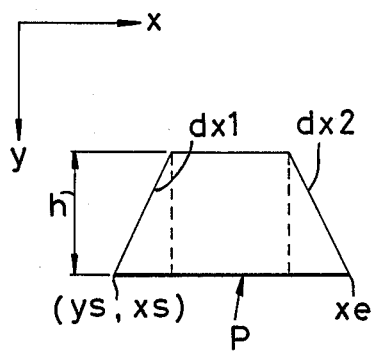
FIGS. 14A and 14B are schematic views showing problems arising in the data formation from a pattern.
Figure 14B:
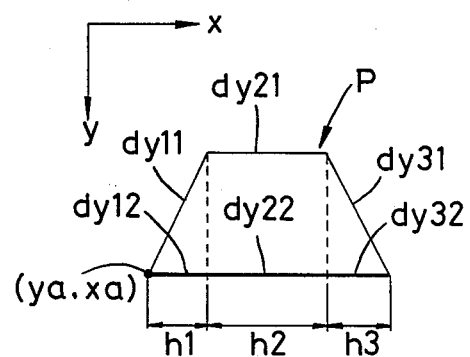

As shown in FIG. 13, the opaque patterns of the mask are mostly composed of rectangular and trapezoidal patterns. In particular, a trapezoidal pattern P can be represented, in a pattern recognition in a y-direction as shown in FIG. 14A, by numeral data OD composed of end positions ys, xs, xe, inclination dx1, dx2 and height h. On the other hand, a pattern recognition of the trapezoidal pattern P in x-direction requires, as shown in FIG. 14B, a larger number of data for example ya, xa, h1–h3, $dy_{11}$, $dy_{12}$, $dy_{21}$, $dy_{22}$, $dy_{31}$ and $dy_{32}$. Consequently a pattern recognition in the y-direction as shown in FIG. 14A allows representing the same pattern with a smaller number of data and to reduce the process required for obtaining an image pattern, detailed in bit units, from design data in the inspecting apparatus. With the recent progress in the degree of integration in integrated circuits, the mask patterns have become finer and more complicated, so that the design data have to be compressed through a suitable selection of the direction of pattern recognition.

Figure 15:
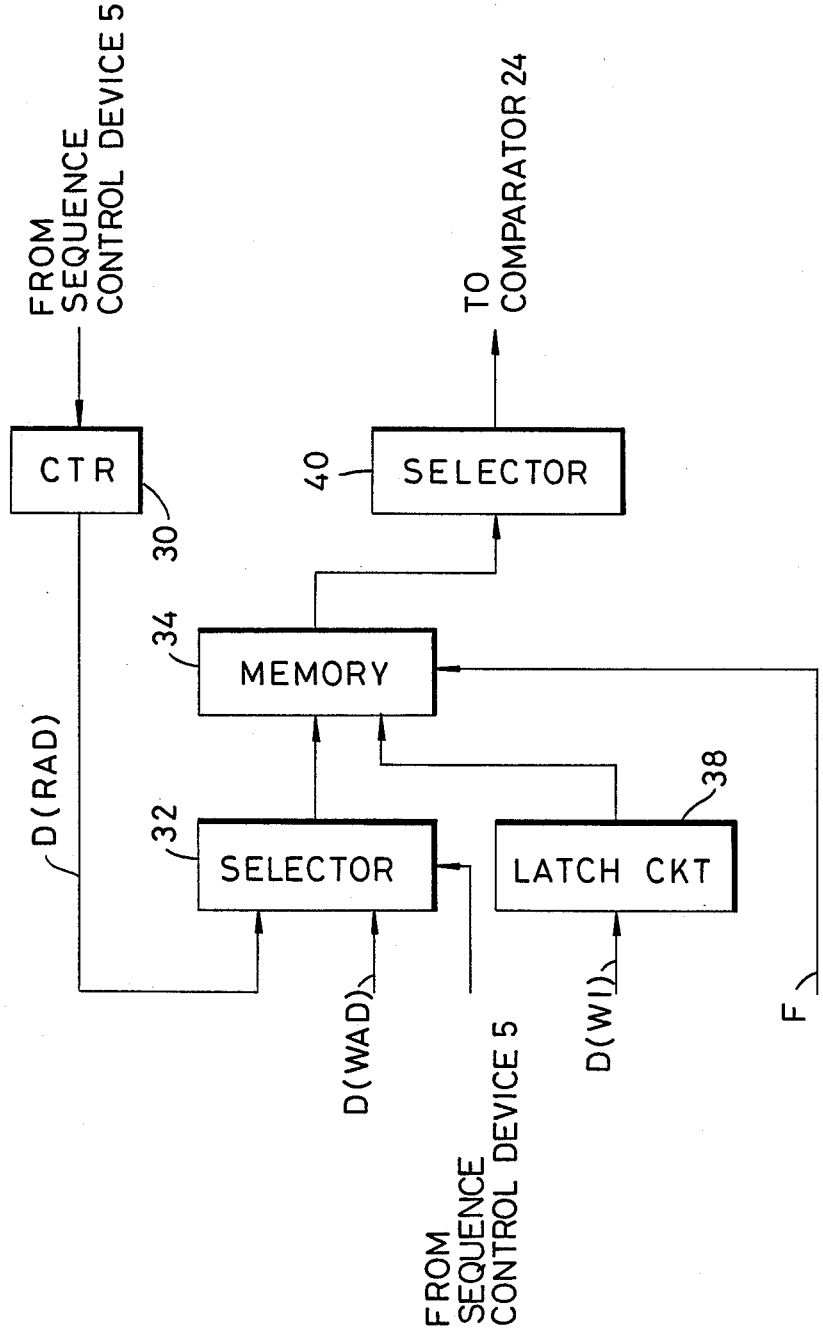
FIG. 15 is a block diagram showing the details of a part of an embodiment of the present invention.

FIG. 15 is a block diagram of a principal part of the embodiment of the present invention, wherein a counter 30 and a selector 40 constitute a part of the reading device 23, while a selector 32, a memory 34 and a latch circuit 38 constitute the memory part 20. In FIG. 15, the output of the counter 30 is connected to an input of the selector 32, of which the other input receives an address signal D(WAD) indicating the address of data to be supplied from the raster information generating device 16 to the memory 34. The counter 30 outputs a count constituting an address signal D(RAD) for reading data recorded in the memory 34. The selector 32 selects either of the address signals D(RAD) and D(WAD) for supply to the memory 34.

The memory 34 is connected to the latch circuit 38 and receives an enable signal through said latch circuit 38.

The memory 34 is further connected to another selector 40 which reads data from the memory 34. The above-mentioned selectors 32, 40, and counter 30 and latch circuit 38 are connected to the sequence control circuit 5 for operational control. The memory part 22 is constructed in a similar manner as the memory part 20, and the reading device 23 comprises a counter and a selector, similar to the counter 30 and the selector 40, for the memory part 22.

Figure 16:
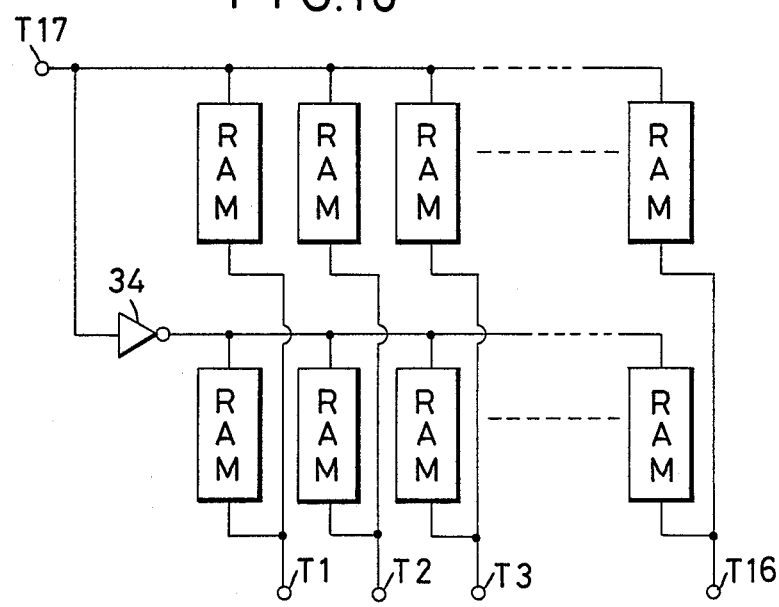
FIG. 16 is a block diagram showing the structure of a memory.
Figure 17:
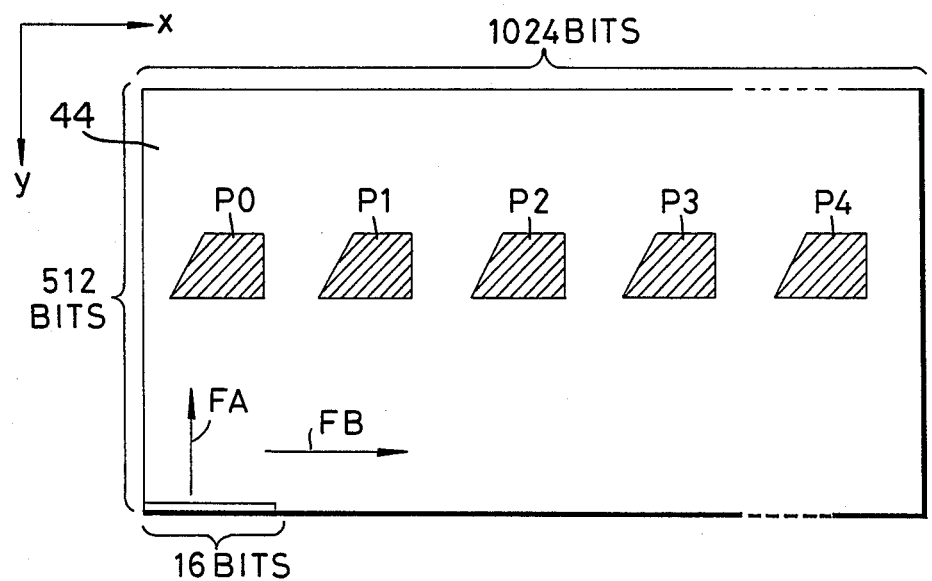
FIG. 17 is a schematic view showing the direction of data storage into the memory and the scanning direction of a linear image sensor.

The memory 34 has an area for example of 512 bits in width and 1024 bits in the scanning direction as shown in FIG. 17, and is capable of data input and output in 16 bits in the scanning direction. FIG. 16 shows an example of structure of the memory 34, which is composed of 32 units of 16K RAM's.

In FIG. 16, the 32 RAM's are equally divided into an upper group and a lower group, and there are provided input terminals T1–T16 for receiving enable signals, each of which is common to an upper RAM and a lower RAM. Thus an enable signal is supplied to two RAM's. On the other hand, the upper or lower RAM is selected by a chip select signal supplied to a terminal T17. The upper RAM's receive said chip select signal while the lower RAM's receive said chip select signal through an inverter 44. Thus a chip select signal "1" or "0" respectively selects the upper RAM's or lower RAM's.

For data entry into said memory 34, there are employed an enable signal of 16 bits indicating the pattern to be stored, an address signal of 15 bits and a 1-bit flag. Said 16-bit enable signal D(W1) is obtained from the numeral data shown if FIG. 14A and is supplied to the memory 34 through the latch circuit shown in FIG. 15.

The 15-bit address signal D(WAD) is supplied to the memory 34 through the selector 32. In 15 bits of the address signal D(WAD), the upper 6 bits represent y-address while the lower 9 bits represent x-address. Particularly the uppermost bit functions as the chip select signal. More specifically, the chip select signal constituted by the uppermost bit of the address signal D(WAD) selects the upper or lower 16 RAM's, in which the y-address is designated by the upper 6 bits while the x-address is designated by the lower 9 bits.

The 1-bit flag F is selected as "1" or "0" by the selector 32 and is entered into the memory 34. Said flag F is supplied to all the RAM's shown in FIG. 16.

In the following there will be given an explanation on the function of the above-explained embodiment. At first, in response to an instruction from the sequence control device 5, the selector 32 is so controlled as to supply the address signal D(WAD) to the memory 34, and the selector 32 is so controlled for example as to supply a flag F of logic value "1" to the memory 34 for obtaining a positive image. Also the memory 34 is cleared to bring all the addresses to "0". Then address signal D(WAD) and D(WI) are supplied to the memory 34. More specifically, the address signal D(WAD) selects either the upper or lower 16 RAM's and designates an address for data storage in thus selected 16 RAM's. Then the enable signal D(WI) selects a RAM, from said 16 RAM's, for storage of the logic value designated by the flag F.

Each block data BD(m, n) is stored, by every 16 bits, in the memory 34, along a direction FA shown in FIG. 17, which lies in the y-direction of the pattern $P_0$ shown in FIG. 14A. Plural patterns stored in the memory 34 are composed of the pattern $P_0$ and similar patterns $P_1$-$P_4$. Consequently the block data are composed of data concerning the pattern $P_0$ and repeating data, indicating the distances of the patterns $P_0$-$P_4$ in the x-direction and the number of the patterns $P_0$-$P_4$. Since the block corresponding to the memory 34 is elongated in the x-direction in which the patterns are repeated, such repeating data can be effectively utilized.

In the following there will be explained the method of read-out of the data stored in the memory 34. At first the sequence control device 5 resets the counter 30, and the selector 32 selects a 15-bit address signal D(RAD), supplied from the counter 30, for supply to memory 34. With the successive count-up operation of the counter 30, the 16-bit data shown in FIG. 17, are read in succession in a direction FA and supplied to a selector 40. Also in this embodiment the pattern on the mask is detected by the movement of the sensor 25 in a direction F1 as shown in FIG. 13, or a direction FB in FIG. 17. Consequently the direction of read-out of the block data from the memory 34 is orthogonal to the moving direction of the sensor 25. The plural areas indicated by broken lines in FIG. 13 respectively correspond to the aforementioned blocks B(m, n).

Figure 18:
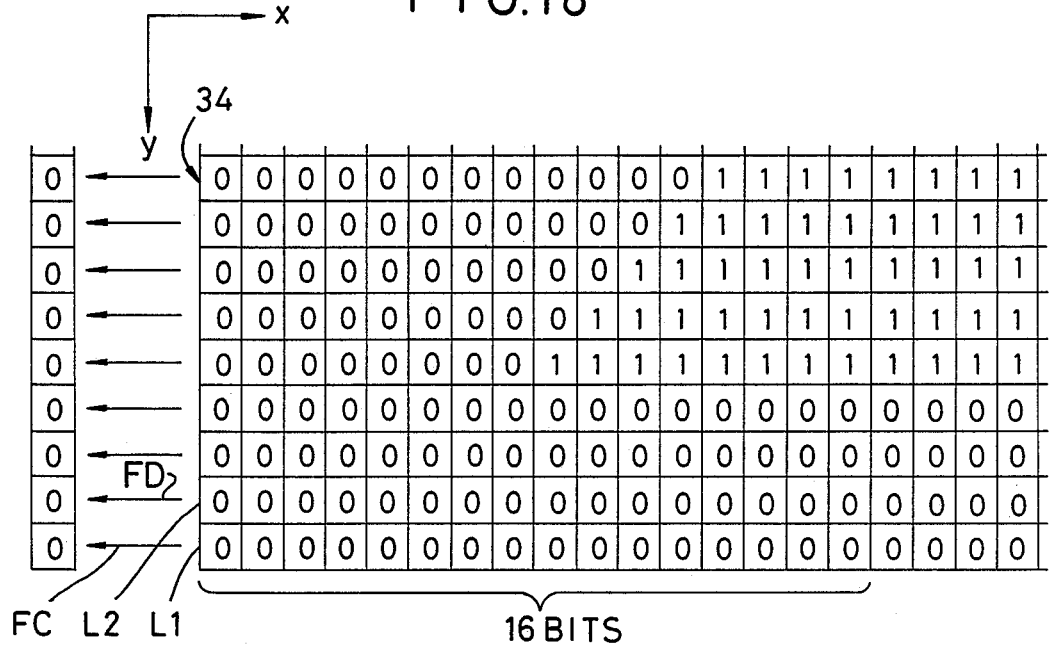
FIG. 18 is a schematic view showing the direction of data reading from the memory.

Upon detecting a pattern of plural bits up to 512 bits, the sensor 25 serially outputs corresponding data, and, in synchronization, the selector 40 selects the data read from the memory 34. More specifically, as shown in FIG. 18, at first 16-bit logic values of a first row L1 of the memory 34 are read, and a logic value positioned at the left-end position of said data is selected and outputted by the selector 40 as indicated by the arrow FC. Then 16-bit data of a second row L2 are read from memory 34, and a first logic value alone is selected and released by the selector 40 as indicated by the arrow FD. Said selector 40 is composed of a multiplexer. A similar operation is repeated for the third row and thereafter. In this manner data are outputted from the memory 34 in synchronization with the data of the pattern on the mask read by the sensor 25. Said data are selected by the selector 40 under the control of the sequence control device 5, in response to the function of the sensor 25. Also the counting operation of the counter 30 is controlled by said control device 5.

In the above-explained embodiment, if an exclusive logic summing is conducted on the address signal D(RAD) supplied from the counter 30 and the result of said summing is used as the address signal for reading the image data, the image data can be read in a direction opposite to the arrow FB shown in FIG. 17, i.e. from the right-hand end instead of from the left-hand end. Thus mirror images of the patterns $P_0$, $P_1$ can be easily obtained.

As explained in the foregoing, the present invention adopts a data storing direction into the memory 34 which is orthogonal to the data reading direction therefrom, whereby it is rendered possible to utilize repeating representation of patterns without increasing the amount of original data to be processed, and to form pattern images in the memory with a simple circuit structure. In this manner splendid effects are obtained in terms of economy, processing speed and flexibility in the data formation.

Figure 19:
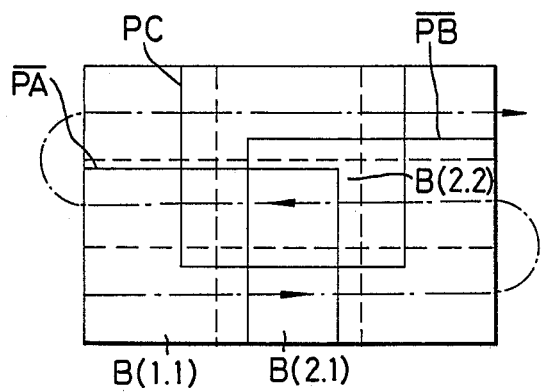
FIGS. 19 and 20 illustrate the principle of an improved embodiment of the present invention.
Figure 20:
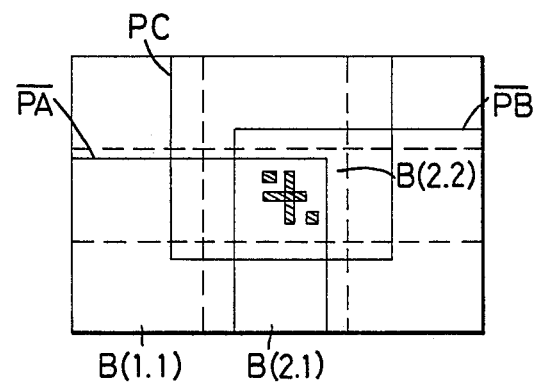

An improved embodiment of the present invention which can inspect a mask design such that patterns PA, PB and PC overlap one another will now be described. The mask pattern shown in FIG. 19 comprises the patterns $\overline{PA}$, $\overline{PB}$ and PC overlapping combined together with their boundaries being in contact with one another, and has been made on the basis of design pattern data DA, DB and DC, and of these, the patterns $\overline{PA}$ and $\overline{PB}$ are the inverted patterns of the design pattern data DA and DB, and particularly as indicated by dotted lines, the inverted patterns $\overline{PA}$ and $\overline{PB}$ partly overlap each other in the divided central block B(2,2).

Figure 21:
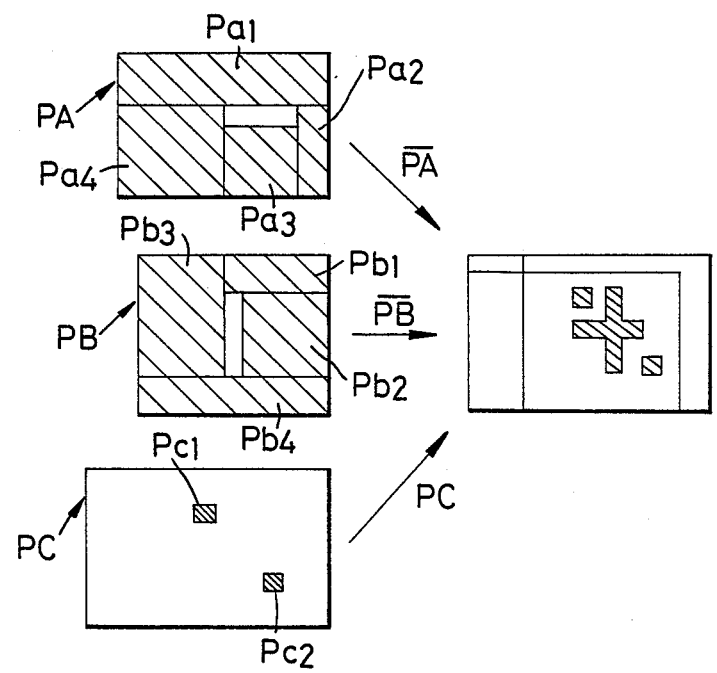
FIG. 21 specifically shows the principle of the improved embodiment of the present invention.

For example, the design data of the pattern PA, as shown in FIG. 21, include a plurality of patterns Pa1–Pa4 forming the pattern PA, and these patterns Pa1–Pa4 provide numerical data representing the end points and inclinations of segments. This also holds true of the design data DB and DC, and the design data DB include patterns Pb1–Pb4 for forming the pattern PB. Also, the design data DC include, as numerical data, patterns Pc1 and Pc2 for forming the pattern PC. The data corresponding to the patterns Pa1–Pa4 are D(Pa1)–D(Pa4), the data corresponding to the patterns Pb1–Pb4 are D(Pb1)–D(Pb4), and the data corresponding to the patterns Pc1 and Pc2 are D(Pc1) and D(Pc2).

The design data DA, DB and DC stored in a data file 10 are written into a magnetic disk 12 by the operation process effected by a data processing circuit 14, as shown in FIG. 1.

Describing more specifically, the three design data DA, DB and DC read from the data file 10 into the data processing circuit 14 are converted for each block B(m,n) (FIG. 19) by the data processing circuit 14 and are stored in the magnetic disk 12. Here, for the convenience of description, it is to be understood that m,n=1-3.

Describing the block B(2,2) as an example of the design data for each block B(m,n) stored in the magnetic disk 12 by the data processing circuit 14, for example, the data DPa1-DPa4 of the pattern PA as shown in FIG. 21 are stored with respect to the block B(2,2), the data DPb1-DPb4 are stored with respect to the pattern PB, and the data DPc1 and DPc2 are stored with respect to the pattern PC.

Further, when storing the design data of the block B(2,2), the data processing circuit 14 effects the process of adding the flag of the inverted image with regard to the design data DA and DB which provide the inverted pattern $\overline{PA}$ and $\overline{PB}$, and the process of adding the flag of a positive image with regard to the design data DC of the uninverted pattern PC.

Further, when storing the design data in the magnetic disk 12, the data processing circuit 14 handles the area in which the pattern of the positive image is included (the area of the pattern PC) or the area in which the pattern of the inverted image is included (the area of the patterns PA and PB) as a pattern on the basis of the information as to whether each pattern provided by the operation of a keyboard 3 is inverted, and effects the process of adding the design data of this pattern as the setting data Pa0, Pb0 and Pc0 of a pattern forming area to be described. The area setting data Pc0 need not be added to the positive pattern PC.

FIG. 22(a) shows the stored condition of the design data BD(m,n) of the block B(m,n) stored in the magnetic disk 12 by the data processing circuit 14, and the details of the design data BD(2,2) of the block B(2,2) are shown in FIG. 22(b).

The substance of the design data BD(2,2) of the block B(2,2) shown in FIG. 22(b) corresponds to the design pattern data shown in FIG. 21, and for the convenience of description, it is to be understood that the design data DC, DA and DB are stored in the named order.

First, the design data DC is comprised of data D(Pc1) and D(Pc2), and since the pattern PC based on this design data DC is the pattern of a positive image, the flag of the positive image is added to the data D(Pc1) and D(Pc2).

Subsequently to the data D(Pc1) and D(Pc2) which constitute the design pattern data DC, the data D(Pa1)-D(Pa4) which constitute the design pattern data DA are stored through a memory change flag MC. Since the pattern PA by these data D(Pa1)-D(Pa4) provides an inverted pattern, an inverted image flag is added to the data D(Pa1)-D(Pa4). Further an area setting data D(Pa0) for handling the area in which the pattern PA of the inverted image is included as a pattern is newly added to the head position of the data D(Pa1)-D(Pa4) to which the inverted image flag has been added, and a positive image flag is attached to this area setting data D(Pa0).

Subsequently to the design data DA comprising such an area setting data D(Pa0) and data D(Pa1)-D(Pa4), data D(Pb1)-D(Pb4) which constitute the design data DB are stored through the memory change flag MC, and an area setting data D(Pb0) for handling the area in which the data D(Pb1)-D(Pb4) are included as a pattern is added to the head position thereof, and since this data DB provides an inverted image, a positive image flag is added to the area setting data D(Pb0) and an inverted image flag is added to the data D(Pb1)-D(Pb4).

Further, END data is stored in the final position of the design data DB(2,2) of the block B(2,2), and indicates the end position of the data stored for each block.

Figure 23:
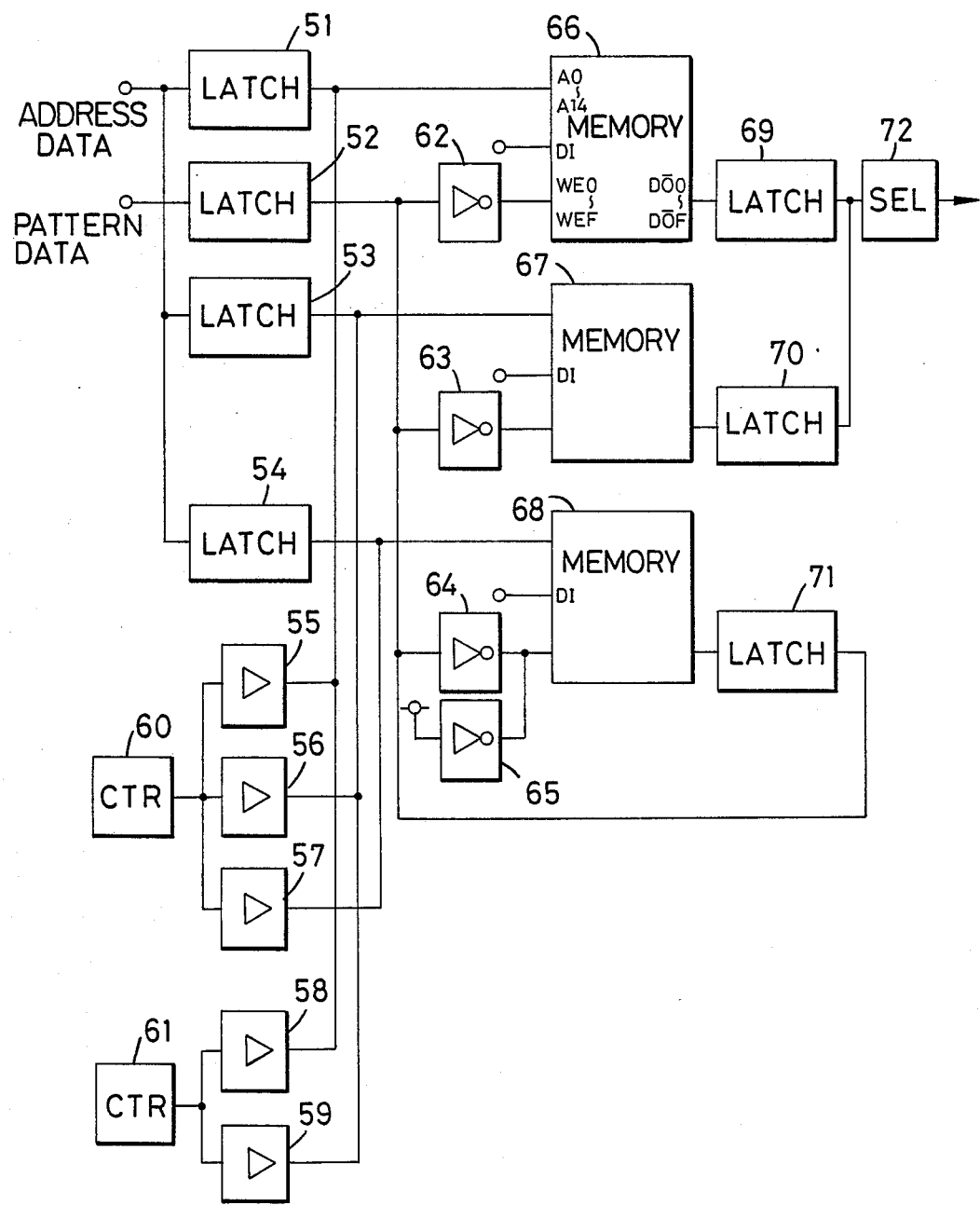
FIG. 23 is a block diagram showing a portion of the construction of the improved embodiment of the present invention.

FIG. 23 is a circuit block diagram of a memory part according to an improved embodiment of the present invention which replaces the memories 20 and 22 in the embodiment of FIG. 1, and three rewritable memories 66, 67 and 68 are provided in this memory part, and when forming the pattern of the block B(2,2), for example, two memories 66 and 68 of the three memories are used, and the remaining memory 67 is used to read out the pattern data already formed during the scanning of the block B(3,2) preceding the block B(2,2) in a comparator 24 in synchronism with the scanning of the mask 1 by a line sensor 25.

In this bit pattern memory shown in FIG. 23, the reference numerals 51, 53 and 54 designate latch circuits for latching address data of the pattern data obtained through a raster information generator 16, and the reference numeral 52 denotes a latch circuit for latching the pattern data obtained through the raster information generator 16. The outputs of the latch circuits 51, 53 and 54 for latching the address data are connected to the address ports A0-A14, respectively, of the memories 66, 67 and 68, and the output of the latch circuit 52 for latching the pattern data is connected to the data writing-in ports $WE_O$-$WE_F$ of the memories 66, 67 and 68 through buffers 62, 63 and 64.

The reference numeral 60 designates a counter for producing the address for transferring and clearing the data between the memories 66-68. The output of the counter 60 is connected to the address ports A0-A14 of the memories 66-68, respectively, through buffers 55, 56 and 57. Further, the reference numeral 61 denotes a read-out counter which produces a read-out address for reading out the pattern data formed in one of the memories 66 and 67. The output of the read-out counter 61 is connected to the address ports A0-A14 of the memories 66 and 67, respectively, through buffers 58 and 59.

Further, the output ports $D0$-$D0_F$ of the memories 66 and 67 used to read out the pattern data are connected to a selector 72 through latches 69 and 70 so as to deliver the pattern data as serial data to the comparator 24 by the selector 72, and the data outputting from this selector 72 is naturally effected in synchronism with the scanning of the mask 1 by the line sensor 25.

On the other hand, the output ports $D0_O$-$D0_F$ of the memory 68 used only for the production of the pattern data are imparted to a latch 71, the output of which is fed back to the data writing-in ports $WE_O$-$WE_F$ of the memories 66, 67, and 68 through the buffers 62, 63 and 64. Further, the output of buffer 65 is imparted to the data writing-in ports $WE_O$-$WE_F$ of the memory 68, and the input of buffer 65 is connected to a power source line so that bit "0" is output by the inverting output, and the bit "0" from this buffer 65 is written into the memory 68, whereby the pattern data once written into memory 68 can be eliminated. The memories 66, 67 and 68 write the bit indicated by the signal input to a port DI into the area indicated by the signal input to ports $AD_0$-$AD_{14}$, in conformity with the ports $WE_O$-$WE_F$. The signal input to the port DI corresponds to the flag of the image of each pattern. That is, when the pattern written into each memory is a positive image, "1" is input to the port DI, and when the pattern, written into each memory is an inverted image, "0" is input to the port DI.

Figure 24A:
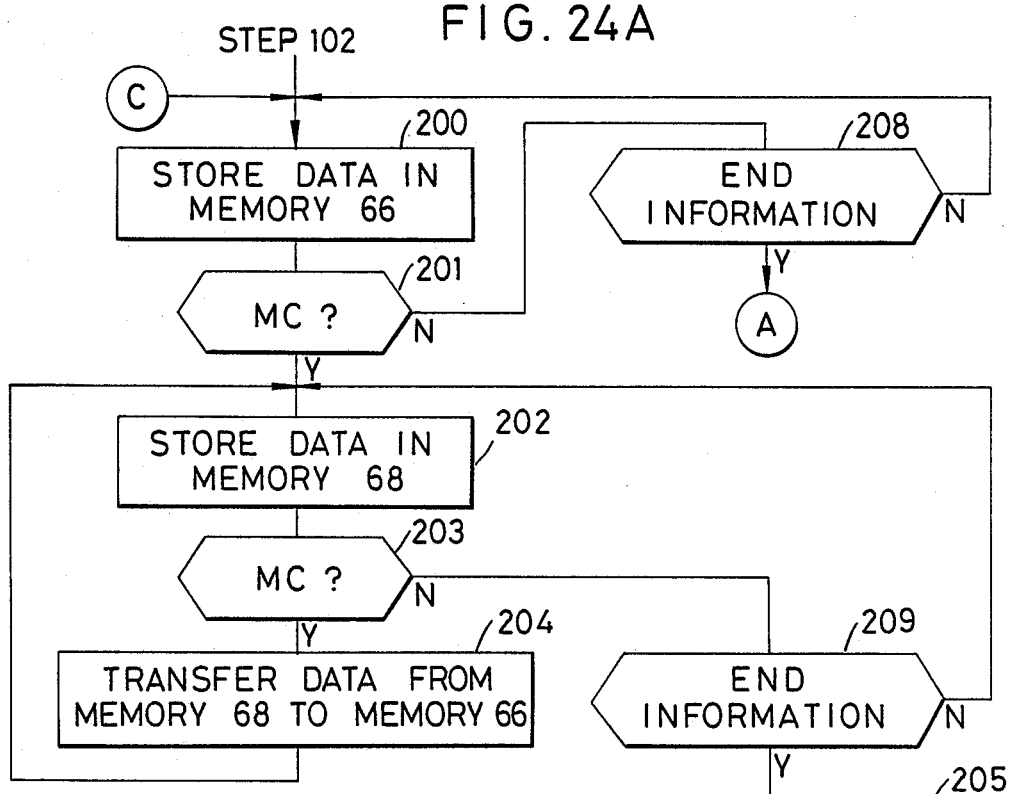
FIGS. 24A and 24B are flow charts showing the operation of the improved embodiment of the present invention.

The operation of the above-described improved embodiment will now be described with reference to FIGS. 24A and 24B.

First, as shown in FIGS. 21 and 22, BD(m,n) is stored in disk 12. This corresponds to the steps 100–102 of FIG. 12.

Subsequently, during the inspection of the flaw of the mask, the design data of the pertinent block is read out from the magnetic disk 12 by the data processing device 14 in the order of the scanning by the line sensor 25 and supplied to the raster information generator 16. The raster information generator 16 produces a bit pattern of 16-bit units as shown in FIG. 17 from the numerical value expressed as a figure, and produces from the flag information whether the X addresses 0–63 and the Y addresses 0–511 on the memory and further the portion of the bit pattern "1" of each XY address should be depicted by the bit "0" (the inverted image) or by the bit "1" (the positive image), and delivers it to the memory part shown in FIG. 23. Of course, at this time, the memory change flag MC and the END information shown in FIG. 22(b) are also delivered.

Reference is now had to the specific circuit construction of the memory part shown in FIG. 23 to describe the operation when the sequence control device 5 causes the raster information generator 16 to effect the pattern producing process in the memory part of FIG. 23 on the basis of the data of the block B(2,2).

When the data of the block B(2,2) has been obtained from the raster information generator 16, the pattern of data BD(3,2) formed during the scanning of the preceding block B(3,2) is already stored in the memory 67 in the memory part of FIG. 23, and therefore the memory 66 and the memory 68 are used to produce the pattern of the block B(2,2).

Figure 25:
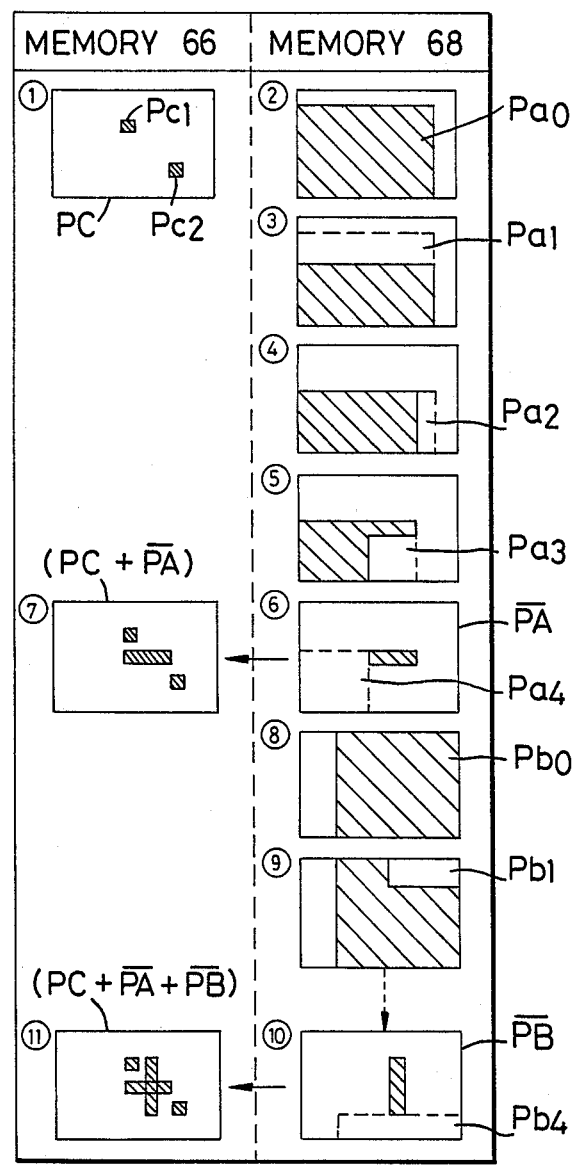
FIG. 25 specifically shows the operation of the improved embodiment of the present invention.

This process of producing the pattern of the block B(2,2) by the use of the memories 66 and 68 is effected via the steps of process ① – ⑪ shown in FIG. 25. Now, in the improved embodiment of the present invention, unlike the embodiment of FIG. 1, the sequence control device 5 monitors the operations of the devices 14 and 16.

Data D(Pc1) and D(Pc2) for depicting the pattern PC are first provided from the raster information generator 16 and therefore, at step 200, the data D(Pc1) and D(Pc2) are written as a positive image into the memory 66 as shown at ① in FIG. 25. At steps 201 and 208, the presence of flag MC and END is judged. If the block B(m,n) has not a plurality of patterns, but a single pattern, e.g., PA alone, shift is made through steps 201 and 208 to step 206, where the output of CCD 25 is compared with the memory 66. In FIG. 22(b), there is a flag MC and therefore, shift is made to step 202.

At step 202, the data D(Pao) and D(Pa1)–D(Pa4) of the pattern PA are stored in the memory 68. On the basis of the area setting data D(Pa0) first obtained for the memory 68, a pattern which makes all the setting areas into bit "1" is written into the area in which the pattern PA is formed, as indicated by hatching at ② of the memory 68 (FIG. 25). Subsequently, data D(Pa1) is obtained and therefore, as indicated at ③ of the memory 68, the portion of the bit pattern corresponding to the data D(Pa1) and indicated by the dotted line is rewritten from bit "1" to bit "0". At steps 203 and 209, the presence of flag MC and END is judged, and storage of the data into the memory 68 is repeated until flag MC between the data DA and DB of FIG. 22(b) is read out. The rewriting is effected so that the portion of bit "1" which provides the inverted pattern $\overline{PA}$ finally remains in the memory 68 as indicated at ⑥ due to the bit inversion by the data D(Pa2)–D(Pa4) successively obtained as indicated at ④–⑥ of the memory 68.

When the writing of the inverted pattern $\overline{PA}$ into the memory 68 is thus terminated by the processes of ②–⑤ and flag MC appears, at step 204, the data of the memory 68 is transferred to the memory 66 storing the pattern PC therein, and the stored condition of the bit pattern provided by the logic sum of the two as shown at ⑦ is created. Of course, simultaneously with the transfer of the pattern data from the memory 68 to the memory 66, the memory 68 is eliminated.

Return is again made to step 204 and the data D(Pb0)–D(Pb4) of the pattern PB are obtained and therefore, the eliminated memory 68 is again used, and as shown at ⑧, on the basis of the area forming data D(Pb0), the bit pattern of bit "1" is written into the area in which the pattern PB is formed, and thereafter, as shown at ⑨–⑩, the bit of the area of the pattern data D(Pb1)–D(Pb4) is likewise rewritten into "0", whereby finally as shown at ⑩, the inverted pattern $\overline{PB}$ is obtained in the memory 68.

If, as shown at ⑩, the inverted pattern $\overline{PB}$ has been stored and formed in the memory 68, shift is made by flag END through step 209 to step 205, where the pattern data in the memory 68 is read out and added to the memory 66, and thus, the combined pattern of the inverted image patterns $\overline{PA}$, $\overline{PB}$ and the positive image pattern PC in the final block B(2,2) is stored and formed as shown at ⑪.

Figure 24B:
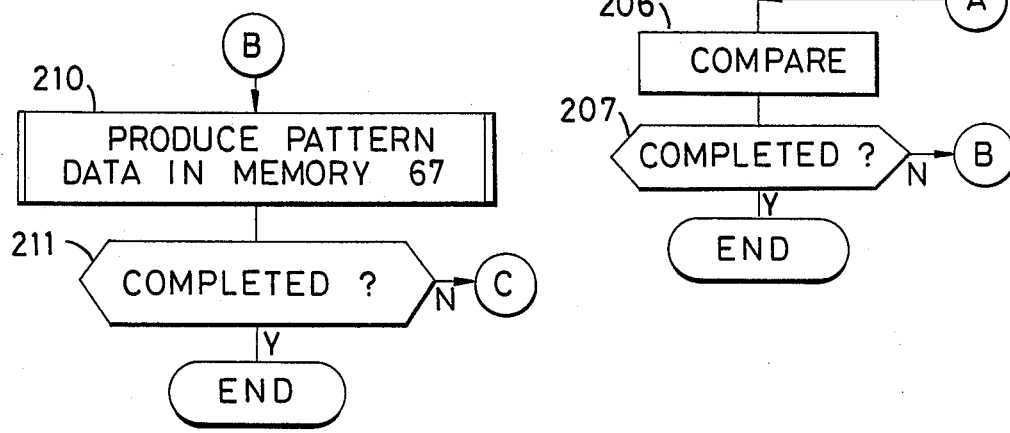

At step 206, the comparison of the output of CCD 25 with the content of the memory 66 is started, and at step 207, whether the comparison of the output of the disk 12 with the output of CCD 25 has been completed with respect to all blocks B(m,n) is judged, and if said comparison has not been completed, shift is made to the step 210 of FIG. 24B. Step 210 corresponds to the steps 200–209 of FIG. 24A. However, it is to be understood that the memory 66 at steps 200, 204 and 205 is replaced by the memory 67. At step 211, judgment similar to step 207 is done, and if the comparison has not been completed, shift is made to the step 200 of FIG. 24A.

There will now be specifically described the writing if the pattern data into memories 66–68 shown in FIG. 23, the memory transfer process of reading out the data written into the memory 68 and adding the read-out data to and storing it in the memory 66 or 67, and the process of reading out the data from the memories 66 and 67.

The writing-in of the pattern data will first be described with the memory 66 taken as an example. The sequence control device 5 makes the control signal input to the write-in control port DI of the memory 66 into "0" or "1". The memory 66 becomes capable of writing thereinto the bit indicated by the control signal. The address data latched by the latch circuit 51 is added, and the address data is provided from the raster information generator 16 to the address ports A0–A14 of the memory 66, and the pattern data output from the raster information generator 16 and latched by the latch circuit 52 is also output by the sequence control device 5 and is input to the data writing-in ports $WE_O$–$WE_F$ of the memory 66 through the buffer 62. The location at which the bit input to the ports WE$_O$–WE$_F$ of the designated address of the memory 66 is "1" is written into the bit indicated by the control signal. This bit of the control signal is the bit of the image signal shown in FIG. 22(b).

The process of adding the data to and storing it in the memory 66 at steps 204 and 205 effected when the writing of the pattern data into the memory 68 has been terminated is as follows.

When the memory change flag MC is supplied from the raster information generator 16, the sequence control device 5 adds the content of the memory 68 to the content of the memory 66 and clears the memory 68. That is, the sequence control device 5 inhibits the latch circuits 51 and 52 from outputting, causes the counter 60 to count up to 0-7FFFH, and causes the output of the counter 60 to be put out to the address ports A0–A14 of the memory 66 and the address ports A0–A14 of the memory 68 through the buffers 55 and 57. As a result, the output data read out from the memory 68 with the same address as the memory 66 is latched by the latch circuit 71 and at this time, the buffers 62 and 65 are permitted to output signals and the buffers 63 and 64 are inhibited from outputting signals, and the output data from the same address of the memory 68 latched by the latch circuit 71 is written into the memory 66, whereafter the sequence control device 5 permits the buffer 65 to output a signal, and all bits 0 are written into memory 68. That is, the clearing of the memory 68 is effected. Of course, the sequence control device 5 inputs a control signal of bit "1" to the writing-in control port DI of the memory 66 and inputs a control signal of bit "0" to the writing-in control port DI of the memory 68, during above-described operation.

Next, when the reading-out of the pattern already stored, for example, in the memory 67 is to be effected, the sequence control device 5 permits the buffer 59 to output a signal and causes the read-out counter 61 to operate, and the address data output from the counter 61 is input to the address ports A0–A14 of the memory 67, and the content of the memory 67 is read out and the output data is latched by the latch circuit 70, and by selector circuit 72, 1 bit is taken out in succession from the 16-bit data obtained through the latch circuit 70 and is read out as serial data by the comparator 24. The selector circuit 72 is provided for the same purpose as the selector 40 of FIG. 15.

Of course, such reading-out of the already stored pattern data from the memory 67 is effected keeping pace with the process of producing and storing new pattern data shown at ①– ⑪ in FIG. 25 and in synchronism with the reading-out of the bit data obtained by the scanning of the mask 1 by the line sensor 25.

Such pattern formation for each block in the bit pattern memory part shown in FIG. 23 and the reading-out of the formed pattern are similar with respect also to the other blocks, and when the scanned position of the mask 1 by the line sensor 25 shifts, for example, from the block B(3,2) to the next block B(2,2), the memory 66 shown in FIG. 23 changes over to the reading-out condition and also changes over to the pattern forming condition for a new block by the memories 67 and 68, and the serial data by the reading-out of the data formed on the basis of the design data are continuously supplied to the comparator 24 while the pattern formation and the reading-out by said memory change-over are alternately repeated for each block.

We claim:

1. A mask inspecting apparatus for inspecting a pattern of a mask, the pattern of which is formed by an opaque material on a radiation-transmitting substrate, on the basis of numerical design data which indicate plural reference patterns, wherein the pattern of said mask is made by inverting at least one of said plural reference patterns and synthesizing said at least one of said plural reference patterns with the remainder of said plural reference patterns, said apparatus comprising:
    first operation means for attaching a first flag to data indicating said remainder of said reference patterns, and attaching a second flag to data indicating said at least one inverted reference pattern;
    second operation means for attaching said first flag to data indicating the entire area of said at least one inverted reference pattern;
    memory means;
    image forming means for storing in said memory means the data and attached flag from said second operation means and thereafter storing in said memory means the data and attached flags from said first operation means; and
    comparing means for comparing the data stored in said memory means with the pattern of said mask.

2. A mask inspecting apparatus according to claim 1, wherein said first flag corresponds to one of two different logic values, and wherein said second flag corresponds to the other of said two different logic values.

3. A mask inspecting apparatus according to claim 2, wherein said memory means stores plural bits, wherein bits in at least one portion of said memory means are set to said other of said two different logic values before said memory means stores data from said image forming means, and wherein said image forming means then stores data at said at least one portion of said memory means.

4. A mask inspecting apparatus according to claim 3, wherein said plural reference patterns do not overlap one another.

5. A mask inspecting apparatus according to claim 1, which further comprises keyboard means for controlling flag attaching by said first operation means.

6. A mask inspecting apparatus according to claim 1, which further comprises classifying means for classifying said design data to which are attached said flags by said first and second operation means into plural blocks corresponding to respective areas of said mask.

7. A mask inspecting apparatus according to claim 6, wherein said classifying means has another memory means including plural parts corresponding to said plural blocks and storing the blocks of classified design data.

8. A mask inspecting apparatus according to claim 7, wherein said image forming means successively reads data from said plural parts of said another memory means and successively stores the read data in the first-mentioned memory means.

9. A mask inspecting apparatus according to claim 8, wherein said comparing means compares the data stored in the first-mentioned memory means with the areas of said mask corresponding to the blocks of data stored therein.

10. A mask inspecting apparatus for inspecting a pattern of a mask, the pattern of which is formed by an opaque material on a radiation-transmitting substrate, on the basis of numerical design data which indicate plural reference patterns, wherein the pattern of said mask is made by inverting at least one of said plural reference patterns and synthesizing said at least one of said plural reference patterns with the remainder of said plural reference patterns, said apparatus comprising:

first operation means for attaching a first flag to data indicating said remainder of said reference patterns, and attaching a second flag to data indicating said at least one inverted reference pattern;

second operation means for attaching, to data indicating the entire area of either said at least one inverted reference pattern or said remainder of said reference patterns, a flag different from the flag which is attached by said first operation means to a corresponding one of said at least one inverted reference pattern or said remainder of said reference patterns;

memory means;

image forming means for storing in said memory means the data and attached flag from said second operation means and thereafter storing in said memory means the data and attached flags from said first operation means; and comparing means for comparing the data stored in said memory means with the pattern of said mask.

11. A mask inspecting apparatus according to claim 10, wherein said first flag corresponds to one of two different logic values, and wherein said second flag corresponds to the other of said two different logic values.

12. A mask inspecting apparatus according to claim 10, wherein said memory means stores plural bits, wherein bits in at least one portion of said memory means are set to said other of said two different logic values before said memory means stores data from said image forming means, and wherein said image forming means then stores data at said at least one portion of said memory means.

13. A mask inspecting apparatus according to claim 10, wherein said plural reference patterns do not overlap one another.

14. A mask inspecting apparatus according to claim 11, which further comprises keyboard means for controlling flag attaching by said first operation means.

15. A mask inspecting apparatus according to claim 11, which further comprises classifying means for classifying said design data to which are attached said flags by said first and second operation means into plural blocks corresponding to respective areas of said mask.

16. A mask inspecting apparatus according to claim 15, wherein said classifying means has another memory means including plural parts corresponding to said plural blocks and storing the blocks of classified design data.

17. A mask inspecting apparatus according to claim 16, wherein said image forming means successively reads data from said plural parts of said another memory means and successively stores the read data in the first-mentioned memory means.

18. A mask inspecting apparatus according to claim 17, wherein said comparing means compares the data stored in the first-mentioned memory means with the areas of said mask corresponding to the blocks of data stored therein.

19. A mask inspecting apparatus according to claim 18, wherein said comparing means has a linear image sensor for detecting the pattern of said mask and producing an output, means for providing a relative displacement between said linear image sensor and said mask in a predetermined direction which is substantially perpendicular to a lengthwise direction of said linear image sensor, and reading means for successively reading the data from said first-mentioned memory means in a direction corresponding to the lengthwise direction of said linear image sensor, and wherein said comparing means compares the data read by said reading means with the output of said linear image sensor.

20. A mask inspecting apparatus according to claim 19, wherein said linear image sensor has a predetermined number of photoelectric elements, and wherein said memory means stores a number of bits along the direction corresponding to the lengthwise direction of said linear image sensor that is equal to said predetermined number of photoelectric elements.

21. A mask inspecting apparatus for inspecting a pattern of a mask, the pattern of which is formed by an opaque material on a radiation-transmitting substrate, on the basis of numerical design data having two different logic values indicating plural reference patterns, wherein the pattern of said mask is made by inverting at least two of said plural reference patterns and synthesizing said at least two reference patterns with the remainder of said plural reference patterns, said apparatus comprising:

memory means provided with first and second memory parts;

first operation means for attaching a first flag to data indicating said remainder of said reference patterns, and attaching a second flag to data indicating said at least two reference patterns, said first flag being indicated by one of said two different logic values, said second flag being indicated by the other of said two different logic values;

second operation means for attaching said first flag to data indicating the areas occupied by said at least two reference patterns;

first image forming means for storing in said first memory part the data indicating said remainder of said plural reference patterns and the first flag attached by said first operation means;

second image forming means for repeatedly storing in said second memory part the data indicating the area occupied by each of said at least two reference patterns and the data indicating said at least two reference patterns to which said second flag is attached by said first operation means;

means for transmitting the data stored in said second memory part to said first memory part upon completion of storing all of the data indicating one of said at least two reference patterns in said second memory part, and forming the logic sum of the data stored in said first memory part and the transmitted data; and comparing means responsive to the completion of transmitting all of the data indicating said at least two reference patterns for comparing the data stored in said first memory part with the pattern of said mask.

22. A mask inspecting apparatus according to claim 21, wherein each of said first and second memory parts stores plural bits, and wherein bits in said first and second memory parts are set to said other of said two different logic values before data is stored in said first and second memory parts by said first and second image forming means.

23. A mask inspecting apparatus according to claim 22, which further comprises keyboard means for controlling flag attaching by said first operation means.

24. A mask inspecting apparatus according to claim 23, which further comprises classifying means for classifying said design data to which are attached said flags by said first and second operation means into plural blocks corresponding to respective areas of said mask.

25. A mask inspecting apparatus according to claim 24, wherein said classifying means has another memory means including plural parts corresponding to said plural blocks and storing the blocks of classified design data.

26. A mask inspecting apparatus according to claim 25, wherein said first and second image forming means successively read data from said plural parts of said another memory means and successively store the read data in said first and second memory parts of the first-mentioned memory means.

27. A mask inspecting apparatus according to claim 26, wherein said comparing means compares the data stored in the first-mentioned memory means with the areas of said mask corresponding to the blocks of data stored therein.

* * * * *